(12) United States Patent
Van De Kerkhof et al.

(10) Patent No.: US 8,045,134 B2
(45) Date of Patent: Oct. 25, 2011

(54) LITHOGRAPHIC APPARATUS, CONTROL SYSTEM AND DEVICE MANUFACTURING METHOD

(75) Inventors: Marcus Adrianus Van De Kerkhof, Helmond (NL); Johannes Henricus Wilhelmus Jacobs, Eindhoven (NL); Tammo Uitterdijk, De Bilt (NL); Nicolas Alban Lallemant, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 446 days.

(21) Appl. No.: 11/373,493

(22) Filed: Mar. 13, 2006

(65) Prior Publication Data

US 2007/0211233 A1   Sep. 13, 2007

(51) Int. Cl.
G03B 27/52 (2006.01)
(52) U.S. Cl. .......................................... 355/30; 355/53
(58) Field of Classification Search .................. 355/53, 355/30
See application file for complete search history.

(56) References Cited

U.S. PATENT DOCUMENTS

| | | | |
|---|---|---|---|
| 3,573,975 A | 4/1971 | Dhaka et al. ................ 117/212 |
| 3,648,587 A | 3/1972 | Stevens ........................... 95/44 |
| 4,346,164 A | 8/1982 | Tabarelli et al. .............. 430/311 |
| 4,390,273 A | 6/1983 | Loebach et al. .............. 355/125 |
| 4,396,705 A | 8/1983 | Akeyama et al. ............. 430/326 |
| 4,405,701 A | 9/1983 | Banks et al. ...................... 430/5 |
| 4,480,910 A | 11/1984 | Takanashi et al. .............. 355/30 |
| 4,509,852 A | 4/1985 | Tabarelli et al. ................ 355/30 |
| 5,040,020 A | 8/1991 | Rauschenbach et al. ....... 355/53 |
| 5,121,256 A | 6/1992 | Corle et al. .................... 359/664 |
| 5,610,683 A | 3/1997 | Takahashi ....................... 355/53 |
| 5,715,039 A | 2/1998 | Fukuda et al. .................. 355/53 |
| 5,825,043 A | 10/1998 | Suwa ............................. 250/548 |
| 5,900,354 A | 5/1999 | Batchelder .................... 430/395 |
| 6,191,429 B1 | 2/2001 | Suwa ............................. 250/548 |
| 6,236,634 B1 | 5/2001 | Lee et al. ....................... 369/112 |
| 6,277,533 B1 | 8/2001 | Wakamoto et al. |
| 6,600,547 B2 | 7/2003 | Watson et al. .................. 355/30 |
| 6,603,130 B1 | 8/2003 | Bisschops et al. .......... 250/492.1 |
| 2002/0020821 A1 | 2/2002 | Van Santen et al. .......... 250/492 |
| 2002/0163629 A1 | 11/2002 | Switkes et al. .................. 355/53 |
| 2003/0123040 A1 | 7/2003 | Almogy .......................... 355/69 |
| 2004/0000627 A1 | 1/2004 | Schuster .................... 250/201.2 |
| 2004/0075895 A1 | 4/2004 | Lin ................................. 359/380 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

Primary Examiner — Edward Glick
Assistant Examiner — Mesfin T Asfaw
(74) Attorney, Agent, or Firm — Pillsbury Winthrop Shaw Pittman LLP

(57) ABSTRACT

An immersion lithographic apparatus is disclosed that has a measurement system or a prediction system for measuring and/or predicting, respectively, an effect associated with a temperature fluctuation of the immersion liquid, and a control system for controlling the or another effect associated with the temperature of the immersion liquid, on the basis of the measurement and/or prediction obtained by the measurement system and/or prediction system, respectively. An associated control system and device manufacturing method is also disclosed.

24 Claims, 4 Drawing Sheets

U.S. PATENT DOCUMENTS

| | | | |
|---|---|---|---|
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | |
| 2005/0046934 A1 | 3/2005 | Ho et al. | 359/380 |
| 2005/0052632 A1 | 3/2005 | Miyajima | 355/30 |
| 2005/0052642 A1* | 3/2005 | Shibata et al. | 356/237.1 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0174550 A1 | 8/2005 | Streefkerk et al. | |
| 2005/0179877 A1 | 8/2005 | Mulkens et al. | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2005/0259234 A1* | 11/2005 | Hirukawa et al. | 355/53 |
| 2005/0264780 A1* | 12/2005 | Graeupner | 355/53 |
| 2006/0033892 A1 | 2/2006 | Cadee et al. | 355/30 |
| 2006/0033898 A1 | 2/2006 | Cadee et al. | 355/30 |
| 2006/0098179 A1* | 5/2006 | Hirukawa | 355/53 |
| 2007/0146663 A1* | 6/2007 | Nagasaka | 355/53 |
| 2007/0153244 A1 | 7/2007 | Zaal et al. | 355/30 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2005-012201 A | 1/2005 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004053955 A1 * | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004107417 A1 * | 12/2004 |
| WO | WO 2005/010611 | 2/2005 |
| WO | 2005/022616 A1 | 3/2005 |
| WO | WO 2005/024517 | 3/2005 |
| WO | WO 2005/071717 | 8/2005 |
| WO | WO 2005/076324 | 8/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial λ/NA scaling equations for resolution, depth of focus, and immersion lithography, *J. Microlith., Microfab., Microsyst.* 1(1):7-12 (2002).

Notice of Reasons for Rejection for Japanese Patent Application No. 2007-055198 dated May 14, 2009.

Notice of Reasons for Rejection for Japanese Patent Application No. 2007-055198 dated Nov. 12, 2009.

European Communication dated Jul. 15, 2011 in corresponding European Patent Application No. 07 103 905.1.

* cited by examiner

LITHOGRAPHIC APPARATUS, CONTROL SYSTEM AND DEVICE MANUFACTURING METHOD

FIELD

The present invention relates to a lithographic apparatus, a control system and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In so called "immersion" lithography, the substrate is immersed in the lithographic projection apparatus in a liquid having a relatively high refractive index, an immersion liquid. For example, the immersion liquid may be water. The immersion liquid fills a space between the projection system and the substrate. In this way, imaging of smaller features is enabled because the exposure radiation has a shorter wavelength in the liquid.

Thus, immersion systems have water or another liquid between the projection system and the substrate during exposure instead of only air or other gas. This results in a direct and strong influence of a thermal variation of the liquid on imaging, since the refractive index of the liquid is a function of temperature. Also, because of strong thermal coupling of the immersion fluid temperature to the projection system, and in particular the optical element of the projection system closest to the substrate, any thermal variation of the liquid will likely have an effect on the imaging properties of the total projection system. Typical thermal control of the immersion liquid may not be good enough to be negligible in terms of focus and imaging related overlay (magnification and distortion). This may be an issue in particular, during scanning exposures where temperature cycles are observed for each substrate. Further, it may become progressively more difficult and more expensive to dynamically control the temperature of the liquid to the required degree with decreasing critical dimension (CD) of the structures being imaged.

SUMMARY

It is desirable to address one or more of those or other problems within an immersion lithographic system. In particular, it is desirable to provide an improved control of imaging quality in an immersion lithographic system, for example, by addressing an effect of one or more temperature variations in the system.

According to an aspect of the invention, there is provided a lithographic apparatus, comprising:
   a substrate table constructed to hold a substrate;
   a projection system configured to project a patterned radiation beam onto a target portion of the substrate;
   a liquid supply system configured to fill a space between the projection system and the substrate with a liquid;
   a measurement system, a prediction system, or both, configured to measure and/or predict, respectively, an effect associated with a temperature fluctuation of the liquid; and
   a control system configured to control the or another effect associated with the temperature of the liquid, on the basis of a measurement and/or prediction obtained by the measurement system and/or prediction system, respectively.

According to an aspect of the invention, there is provided a lithographic projection apparatus arranged to project a pattern from a patterning device onto a substrate using a projection system, the apparatus comprising:
   a liquid supply system for filling a space between the projection system and the substrate with a liquid;
   a measurement system, a prediction system, or both, for measuring and/or predicting, respectively, an effect associated with a temperature fluctuation of the liquid; and
   a control system for controlling the or another effect associated with the temperature of the liquid, on the basis of a measurement and/or prediction obtained by the measurement system and/or prediction system, respectively.

According to an aspect of the invention, there is provided a control system to control a lithographic apparatus, the control system configured to control an effect associated with a temperature fluctuation of an immersion liquid in a lithographic apparatus, on the basis of a measurement, a prediction, or both, obtained by, respectively, a measurement system, a prediction system, or both.

According to an aspect of the invention, there is provided a device manufacturing method, comprising:
   projecting a patterned radiation beam, through a liquid, onto a substrate using a projection system;
   measuring, predicting, or both, an effect associated with a temperature fluctuation of the liquid; and
   controlling the or another effect associated with the temperature fluctuation of the liquid, on the basis of a measurement and/or prediction obtained by the measuring and/or predicting, respectively.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
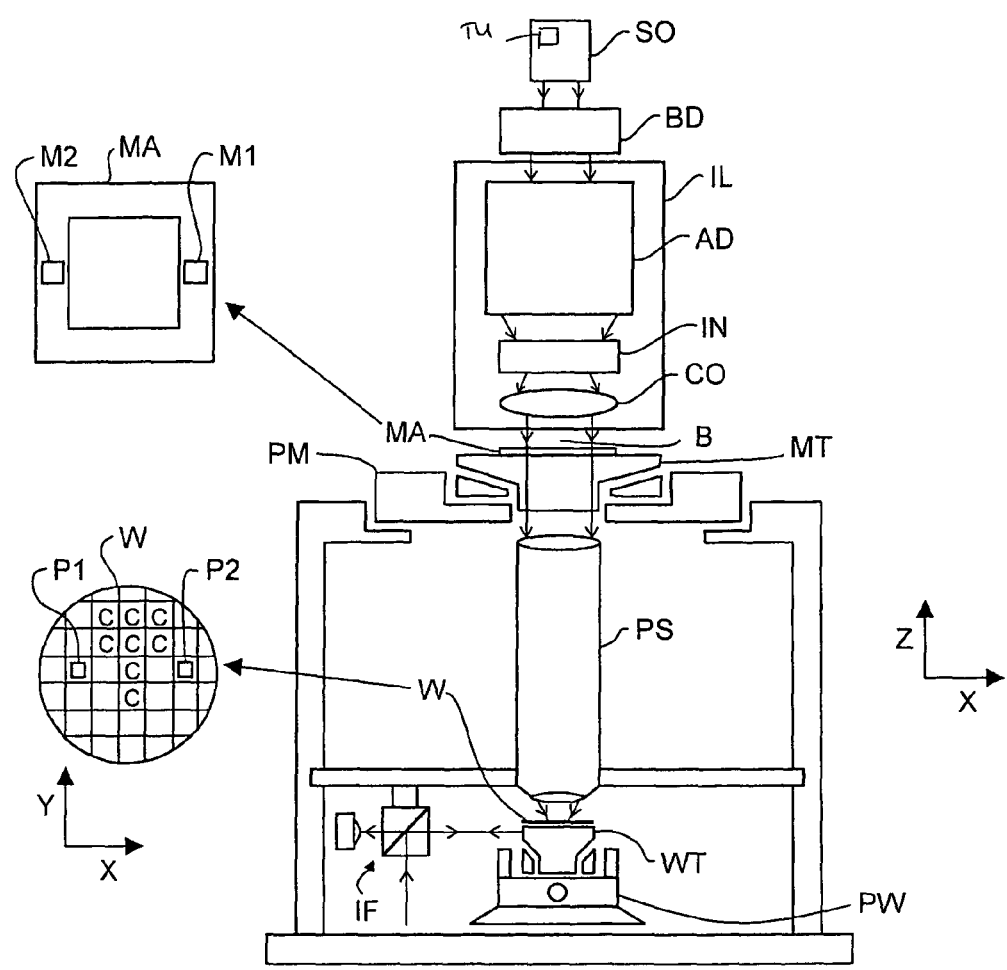
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
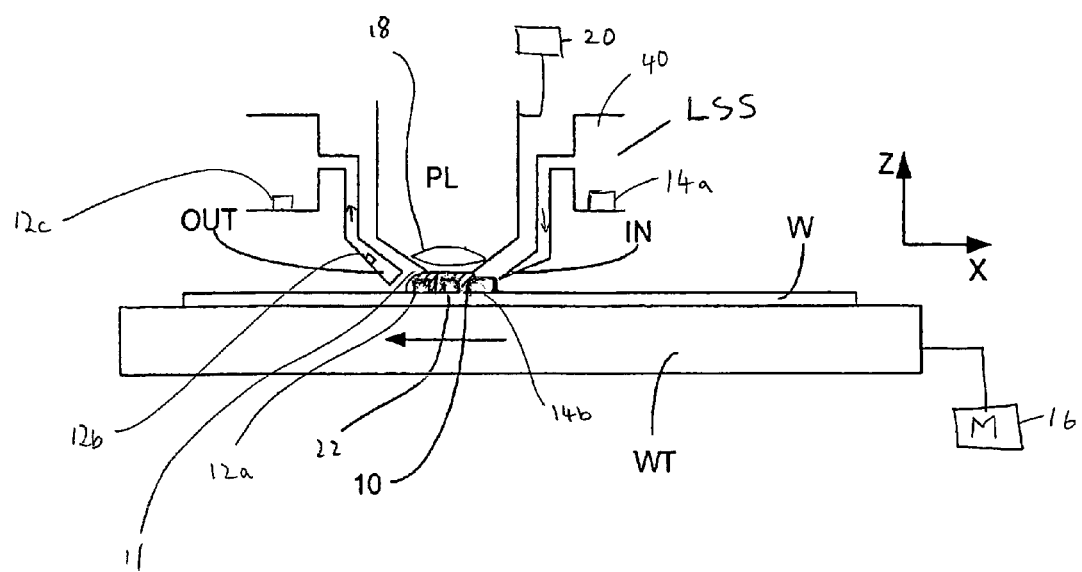
FIG. 2 depicts details of a lithography apparatus as shown in FIG. 1 according to an embodiment of the invention.

FIG. 2 depicts details of a lithography apparatus as shown in FIG. 1 according to an embodiment of the invention. FIG. 2 shows a substrate table WT constructed to hold a substrate W. A projection system PL is configured to project the patterned radiation beam onto a target portion of the substrate W. An immersion liquid supply system LSS is configured to fill a space 10 between the projection system PL and the substrate W with an immersion liquid. The apparatus further comprises a measurement system MS and/or a prediction system PS (see, for example, FIG. 3) configured to measure and/or predict, respectively, one or more variations in the immersion liquid temperature. The apparatus may further comprise a control system CS configured to control the temperature of the immersion liquid, an associated effect of the one or more variations of the immersion liquid temperature, or both, on the basis of a measurement and/or prediction obtained by measurement system MS and/or prediction system PS, respectively. The measurement system MS comprises one or more sensors including temperature sensors 12a, b, c and an optical sensor 22. The sensors are configured to detect conditions in the apparatus, such as the temperature of the immersion liquid, an optical characteristic of the radiation beam, etc. Based on the sensed parameter, the control system (described with reference to FIG. 3) is configured to provide a feedback control signal, a feedforward control signal or both to control a characteristic in the apparatus, such as the temperature of the immersion liquid or to correct for a sensed characteristic. In this way, a versatile control is achieved, whereby a correction for both small and large variations may be accounted for in an appropriate manner. For example, a small temperature fluctuation may be swiftly corrected for by, for example, adjusting an optical element (e.g., a lens) in the projection system using a feedback control.

In one embodiment, the measurement system MS comprises a temperature sensor 12a to measure a temperature of the immersion liquid in the space 10. The temperature sensor 12a may be disposed in or near an exposure area and is configured to measure the temperature of the liquid. Subsequently, feedback control may be used to stabilize the temperature of the liquid. In this way, a relatively large temperature drift may be corrected for and a substantially constant immersion liquid temperature may be achieved. The feedback control signal is fed to a thermal conditioning unit 14a, 14b, which is configured to thermally condition the liquid, for example, by appropriate heating or cooling in accordance with the feedback control signal. For example, if the temperature sensor 12a detects that the temperature is above a certain level, the feedback control signal to the thermal conditioning unit 14a, 14b will control the thermal conditioning unit to cool the immersion liquid a certain amount. The thermal conditioning unit 14a, 14b may be located in the liquid supply system LSS. For example, it may be located in a liquid storage 40 from which the liquid is supplied to the space 10. Alternatively, or in addition, a thermal conditioning unit 14b may be located in or in the vicinity of the space 10. Alternatively, or in addition, to providing a feedback control signal to the thermal conditioning unit 14a, 14b, the control system CS may be configured to provide a feedback control signal to a substrate table positioning system 16, which may include a motor M to adjust the position of the substrate table WT, and/or an optical element adjustment system 20 configured to adjust the position of an optical element 18. For example, the optical element adjustment system 20 may be configured to move the optical element 18 in at least one of an X, Y, Z and tilt direction. Further, the control system may be configured to provide a feedback control signal to a tuner TU comprised in the source SO (see, for example, FIG. 1) to adjust the wavelength of the radiation beam B on the basis of a sensed parameter. By adjusting parameters such as the position of one or more lithographic apparatus components and/or wavelength of the beam, a temperature effect or an optical aberration (as described hereinbelow) may be compensated or corrected for quickly. Such adjustment may be particularly suited, for example, to take into account a relatively small variation of temperature.

In a further embodiment, a temperature sensor 12b, 12c may be disposed down stream of an exposure location 11. The liquid supply system LSS may comprise an outlet OUT through which the immersion liquid may flow downstream from the space 10 between the projection system PL and the substrate W. The measuring system MS may further comprise a sensor 12b, 12c located in the flow downstream of the space 10 to measure a temperature of the immersion liquid downstream of the space 10. In this way, volume conflicts within the confined area in and around an exposure location 11 where exposure takes place, may be avoided.

In a further embodiment, the measurement system may comprise an optical sensor 22 configured to sense one or more optical characteristics of a beam of radiation, such as the patterned radiation beam, passing through the projection system. By sensing one or more optical characteristics of the radiation beam, an aberration which may result from temperature variation in the immersion liquid or elsewhere may be taken into account. In such an embodiment, the control system CS is configured to provide a feedback control signal to a thermal conditioning system 14, a substrate table positioning system 16, an optical element adjustment system 20 and/or a tuner TU, to correct for the aberration on the basis of the sensed one or more optical characteristics. Thus, in addition, or alternatively, to measuring a temperature in the lithographic apparatus, an optical effect may be measured, and a correction may be provided on the basis of the measured optical effect.

The optical sensor 22 may be a continuous focus measurement sensor and/or a magnification sensor and/or an aberration measurement device. Further, the continuous focus measurement sensor 22 may be an external sensor or a through an optical element focus sensor configured to sense a focus through one or more optical elements 18 in the projection system PL. In one embodiment, a continuous focus measurement focus and/or magnification is used. Subsequently, the temperature of the liquid is corrected and/or the imaging effect is corrected by adjusting the substrate table position, an optical element position and/or a wavelength of the radiation beam B. The focus measurement may be either external, for example, a oblique beam level sensor, or through an optical element measurement. In a further embodiment, a through an optical element focus sensor, for example, a transmission image sensor (TIS) and/or an inline interferometer (e.g., a projection system lens interferometer integrated in the lithographic apparatus such as the ASML ILIAS™ system) may be used to periodically measure a focus effect of temperature fluctuation between die exposures and use feedback control as described above. In particular, the optical sensor 22 may be configured to periodically measure a focus effect of a temperature fluctuation in the immersion liquid in between exposures.

Figure 3:
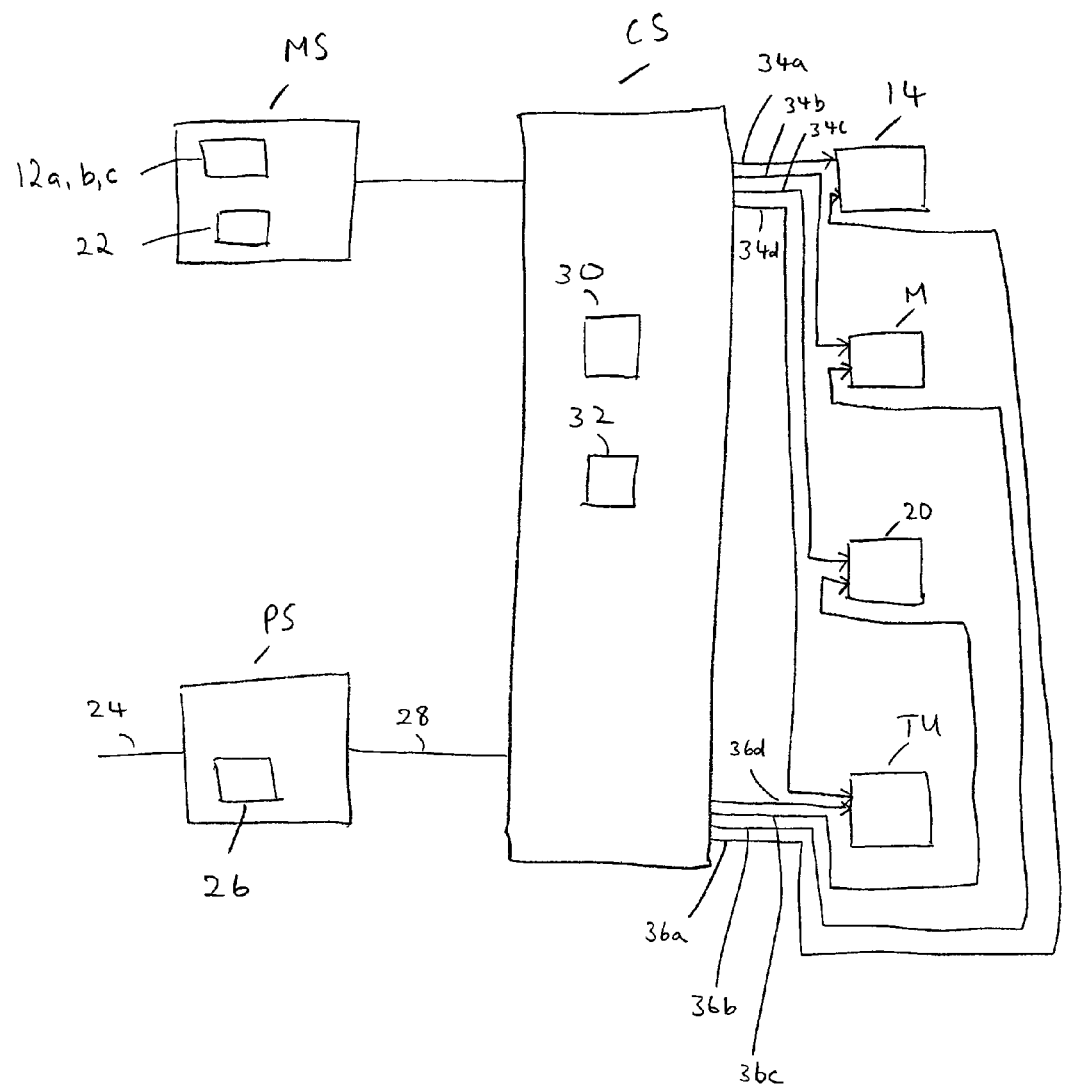
FIG. 3 depicts details of a control system, measurement system and prediction system of the lithographic apparatus shown in FIG. 1 according to an embodiment of the invention.

In a yet further embodiment, a prediction system PS, described in more detail with respect to FIG. 3, may be used. In such an embodiment, the cyclical substrate to substrate behavior may be used to provide a model for providing feedforward correction to a liquid temperature, a substrate table position, an optical element position and/or a wavelength of the radiation beam. In this way, the predicted behavior of one or more components of the apparatus, for example, the predicted optical element heating behavior can be corrected for by using a model. In this way, an error associated with measuring one or more parameters may be avoided. Further, by using a feedforward control signal any effect may be corrected for more quickly since there is no delay between making a measurement and providing a control signal on the basis of the measurement, as is the case with feedback control.

In one embodiment, both feedback and feedforward control may be used. In this way, a balance is achieved. A fast correction may be achieved with a feedforward control, yet an accurate control may be achieved using feedback control, which is not dependent on the accuracy of a modeled behavior but rather uses measured results.

FIG. 3 depicts details of a control system, measurement system and prediction system of the lithographic apparatus shown in FIG. 1 according to an embodiment of the invention. In particular, FIG. 3 depicts a measurement system MS. The measurement system may comprise one or more sensors 12, 22 configured to measure a parameter. For example, one or more temperature sensors 12a, b, c may be provided to measure the temperature of the immersion liquid. Further, one or more optical sensors 22 may be provided to measure an optical characteristic, such as focus and/or magnification. In particular, the measurement system MS may be configured to measure an optical effect of the projection system PL. A prediction system PS may also or alternatively be provided. The prediction system PS may comprise a modeling system 26 configured to provide a model 28 of a thermal effect over the substrate W. Input data 24 relating to known behavior of the substrate is input to the modeling system 26. On the basis of the input data 24, a model 28 of the behavior of the substrate W is formed.

The output of the measurement system MS and/or the prediction system PS is fed to a control system CS. The control system is configured to provide a feedback control 34a, b, c, d on the basis of the measurement obtained by the measurement system MS. Alternatively or in addition, the control system is configured to provide a feedforward control 36a, b, c, d on the basis of the prediction obtained by the prediction system PS. The control system CS may comprise a data processor 30 to process data input to the control system CS and a data storage unit 32 to store such data.

In particular, on the basis of the data provided to the control system CS by the measurement system MS, the control system CS is arranged to provide at least one feedback control signal 34a, b, c, d, to at least one apparatus component, respectively. For example, a feedback control signal may be provided to adjust an optical element 18 in the projection system via an optical element adjustment system 20, a wavelength of the radiation beam via a tuner TU, a position of the substrate table via a substrate table positioning system 16, M, and/or a temperature of the immersion liquid via the thermal conditioning system 14, on the basis of the measured optical effect and/or the temperature of the immersion liquid. In particular, feedback control signal 34a provides feedback control to the thermal conditioning system 14, feedback control signal 34b provides feedback control to the motor M of the substrate table positioning system 16, feedback control signal 34c provides feedback control to the optical element adjustment system 20 and feedback control signal 34d provides feedback control to the tuner TU of the source SO to adjust the wavelength of the radiation beam. In one or more embodiments, where an optical effect is measured, feedback control is provided to adjust the optical element, the wavelength, the substrate table position and/or the temperature of the immersion liquid in response to the measured optical effect using feedback control. An advantage of such a control is that it can be very fast. As mentioned, the control system CS may be arranged to provide a feedback control signal 34a on the basis of the temperature sensed in the space 10 to control the temperature of the immersion liquid to reduce or minimize a temperature fluctuation of the immersion liquid in the space 10. In this way, feedback control may be used to correct for relatively large fluctuations. By using a combination of feedback control, i.e. by using feedback control to adjust one or more components of the apparatus, such as the position of the substrate table, etc., and feedback control to correct for a large temperature fluctuation by providing a feedback control signal 34a to the immersion liquid, both drift (large) and small effects may be compensated for effectively.

In one embodiment, the control system CS may be arranged to provide a feedback control signal 34b, c, d on the basis of the temperature sensed in the space 10 by sensor 12a to correct for an associated imaging effect by providing a feedback control signal 34b, c, d to an adjustment element 16, 20, TU configured to adjust a position of the substrate table 16, a position of one or more optical elements 18, 20 in the projection system PL and/or a wavelength of the radiation beam B using, for example, a tuner TU. Further, the control system CS may be arranged to provide a feedback control signal 34a to control a temperature of the immersion liquid in the space 10 between the projection system PL and the substrate W on the basis of the temperature sensed downstream of the space by sensor 12b, c. Further, the control system CS may be arranged to provide a feedback control signal 34b, c, d on the basis of the temperature sensed downstream of the space 10 by sensor 12b, c to correct for an associated imaging effect by providing a feedback control signal 34b, c, d to an adjustment element 16, 20, TU configured to adjust a position of the substrate table WT, a position of one or more optical elements 18, 20 in the projection system PL, and/or a wavelength of the radiation beam B using, for example, tuner TU. Further, the control system CS may be arranged to provide a feedback control signal 34a to control a temperature of the immersion liquid in the space 10 between the projection system PL and the substrate W on the basis of the optical characteristic sensed by the optical sensor 22. In particular, the control system CS may be arranged to provide a feedback control signal 34b, c, d on the basis of one or more optical characteristic sensed by the optical sensor 22 to correct for an associated imaging effect by providing a feedback control signal 34b, c, d to an adjustment element 16, 20, TU configured to adjust a position of the substrate table WT, a position of one or more optical elements 18, 20 in the projection system and/or a wavelength of the radiation beam B using, for example, a tuner TU.

With respect to the prediction system PS, the control system CS may use the model 28 to correct for an thermal effect using feedforward control. The feedforward control signal 36a, b, c, d may include a feedforward control 36a to the thermal conditioning system 14, a feedforward control signal 36b to the substrate table positioning system 16, M, a feedforward control signal 36c to the optical element adjustment system 20, and/or a feedforward control signal 36d to a component, such as tuner TU to adjust the wavelength of the radiation beam B. The adjustment elements and conditioning system respond to the feedforward control signal or signals 36a, b, c, d in the same way as they would as described with reference to the feedback control signals 34a, b, c, d.

As mentioned above, the control system may provide a combination of control signals based on both feedback and feedforward control. While FIG. 2 shows the feedforward control signals and feedback control signals as separate entities, the control system CS may be arranged to provide a control signal including a combination of feedback and feedforward control. In particular, the control system may provide a single control signal including a plurality of feedback and feedforward control components. Further, the control system CS may be arranged to provide control signals to one or more of the adjustment or conditioning systems.

In one embodiment, there is provided a lithographic projection apparatus arranged to project a pattern from a patterning device onto a substrate W. The apparatus may comprise an immersion liquid supply LSS system configured to fill a space 10 between the projection apparatus PL and the substrate W with an immersion liquid. The apparatus may further comprise a measurement system MS and/or a prediction system PS to measure and/or predict, respectively, one or more variations in the immersion liquid temperature. The apparatus may further comprise a control system CS to control the temperature of the immersion liquid and/or an associated effect of a variation of the immersion liquid temperature, on the basis of a measurement and/or prediction obtained by the measurement system MS and/or the prediction system PS, respectively.

In a further embodiment, there is provided a control system CS to control a lithographic apparatus, the control system CS configured to control a temperature of an immersion liquid and/or an associated effect of a variation of the immersion liquid temperature, on the basis of a measurement and/or prediction obtained by a measurement system MS and/or a prediction system PS, respectively.

In a yet further embodiment, there is provided a device manufacturing method comprising projecting a patterned radiation beam, through a liquid, onto a target portion of a substrate using a projection system, measuring and/or predicting one or more variations in the immersion liquid temperature, and controlling the temperature of the immersion liquid and/or an associated effect of the one or more variations of the immersion liquid temperature, on the basis of a measurement and/or prediction obtained by the measuring and/or predicting, respectively.

Figure 4:
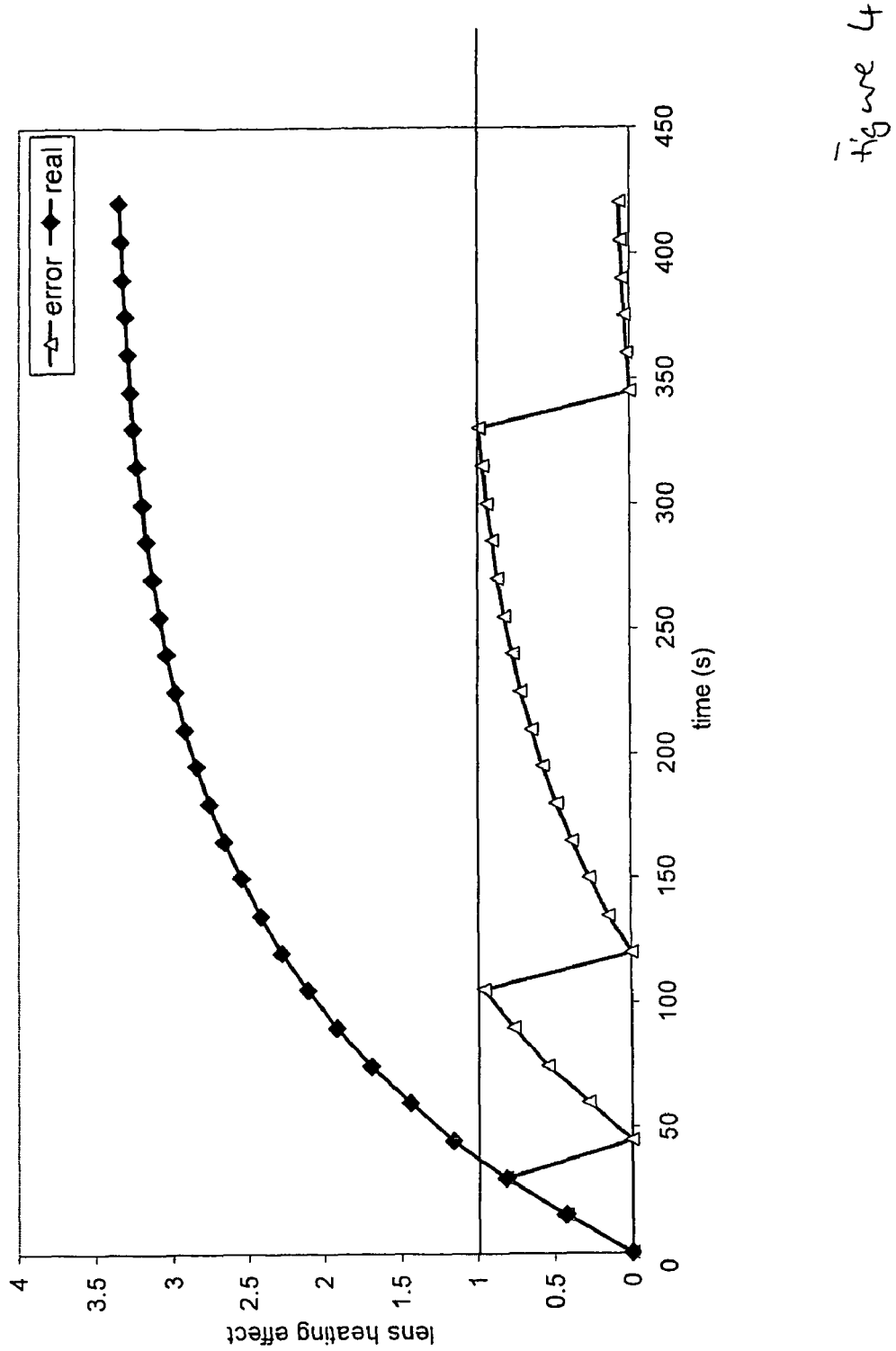
FIG. 4 shows a generic feedback scheme according to an embodiment of the invention.

FIG. 4 shows a generic feedback scheme according to an embodiment of the invention. In particular, FIG. 4 shows an error with respect to the real optical element (e.g. lens) heating effect, where a feedback measurement is triggered when the correction by the feedforward model exceeds a certain control limit, which is determined by the accuracy of the feedforward model. Thus, a very accurate feedforward control (which also implies that all relevant parameters are accurately known to the feedforward model) requires only a few feedback measurements, while a less accurate feedforward control requires frequent feedback measurements in order to stay within the control limit.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a substrate table constructed to hold a substrate;
a projection system configured to project a patterned radiation beam onto a target portion of the substrate;
a liquid supply system configured to fill a space between the projection system and the substrate with a liquid;
a measurement system configured to measure an effect associated with a temperature fluctuation of the liquid, the measurement system comprising an optical sensor configured to sense a radiation beam passing through liquid in the space at the same time that the patterned radiation beam is projected onto the substrate held on the substrate table, the sensor arranged so as to receive the radiation beam without the radiation beam having passed through the projection system or to receive the radiation beam from the projection system before or without the radiation beam re-entering the projection system; and
a control system configured to determine, from the sensed beam, an effect associated with a temperature fluctuation of the liquid and to adjust the temperature of the liquid, the effect associated with the temperature fluctuation, or both.

2. The apparatus of claim 1, wherein the control system is configured to provide a feedback control on the basis of the measurement obtained by the measurement system.

3. The apparatus of claim 2, wherein the measurement system is arranged to measure an optical effect of the projection system and the control system is arranged to adjust, on the basis of the measured optical effect, (i) an element in the projection system, (ii) a wavelength of the radiation beam, (iii) a position of the substrate table, (iv) a temperature of the liquid, or (v) any combination of (i)-(iv).

4. The apparatus of claim 1, further comprising a prediction system configured to predict an effect associated with a temperature fluctuation of the liquid and wherein the control system is configured to provide a feedforward control on the basis of the prediction obtained by the prediction system.

5. The apparatus of claim 4, wherein the prediction system comprises a modeling system configured to provide a model of a thermal effect over the substrate.

6. The apparatus of claim 5, wherein the control system is configured to use the model to correct for the thermal effect using feedforward control.

7. The apparatus of claim 1, wherein the measurement system comprises a temperature sensor configured to measure a temperature of the liquid and wherein the control system is configured to provide a feedback control signal to the apparatus on the basis of the temperature sensed by the temperature sensor.

8. The apparatus of claim 7, wherein the feedback control signal is provided to (i) a thermal conditioning system, (ii) a substrate table positioning system, (iii) an optical element positioning system, wherein the optical element is comprised in the projection system, (iv) a system configured to adjust a wavelength of the radiation beam, or (v) any combination of (i)-(iv).

9. The apparatus of claim 7, wherein the control system is arranged to provide a feedback control signal on the basis of a temperature sensed in the space to control the temperature of the liquid to minimize a temperature fluctuation of the liquid in the space.

10. The apparatus of claim 7, wherein the control system is arranged to provide a feedback control signal on the basis of a temperature sensed in the space to correct for an associated imaging effect by providing a feedback control signal to an adjustment element configured to adjust (i) a position of the substrate table, (ii) a position of one or more optical elements in the projection system, (iii) a wavelength of the radiation beam, or (iv) any combination of (i)-(iii).

11. The apparatus of claim 1, further comprising an outlet, through which the liquid can flow, downstream from the space between the projection system and the substrate, and wherein the measuring system further comprises a sensor located in the flow downstream of the space to measure a temperature of the liquid downstream of the space.

12. The apparatus of claim 11, wherein the control system is arranged to provide feedback control to control a temperature of the liquid in the space between the projection system and the substrate on the basis of the temperature sensed downstream of the space.

13. The apparatus of claim 12, wherein the control system is arranged to provide a feedback control signal on the basis of the temperature sensed downstream of the space to correct for an associated imaging effect by providing a feedback control signal to an adjustment element configured to adjust (i) a position of the substrate table, (ii) a position of one or more optical elements in the projection system, (iii) a wavelength of the radiation beam, or (iv) any combination of (i)-(iii).

14. The apparatus of claim 1, wherein the optical sensor comprises a continuous focus measurement sensor, a magnification sensor, an aberration measurement device, or any combination of the foregoing.

15. The apparatus of claim 14, wherein the optical sensor is configured to periodically measure a focus effect of a temperature fluctuation in the liquid between exposures.

16. The apparatus of claim 1, wherein the control system is arranged to provide feedback control to control a temperature of the liquid in the space between the projection system and the substrate on the basis of the optical characteristic sensed by the optical sensor.

17. The apparatus of claim 1, wherein the control system is arranged to provide a feedback control signal on the basis of the optical characteristic sensed by the optical sensor to correct for an associated imaging effect by providing a feedback control signal to an adjustment element configured to adjust (i) a position of the substrate table, (ii) a position of one or more optical elements in the projection system, (iii) a wavelength of the radiation beam, or (iv) any combination of (i)-(iii).

18. The apparatus of claim 1, wherein the sensor comprises a continuous focus measurement sensor arranged as an external sensor or as a through the optical element focus sensor configured to sense a focus through one or more optical elements in the projection system.

19. A lithographic projection apparatus comprising:
a substrate table constructed to hold a substrate;
a projection system configured to project a patterned radiation beam onto a target portion of the substrate;
a liquid supply system configured to fill a space between the projection system and the substrate with a liquid;
a measurement system configured to measure an effect associated with a temperature fluctuation of the liquid, the measurement system comprising an optical sensor configured to sense a radiation beam passing through liquid in the space, the sensor arranged so as to receive the radiation beam without the radiation beam having passed through the projection system or to receive the radiation beam from the projection system before or without the radiation beam re-entering the projection system and configured to measure a focus of radiation passing through the liquid in the space; and
a control system configured to move the optical sensor to a position under the projection system between exposures of the same substrate while the substrate is held on the substrate table and to determine, from the sensed beam and measured focus, an effect associated with a temperature fluctuation of the liquid and to adjust the temperature of the liquid, the effect associated with the temperature fluctuation, or both.

20. A device manufacturing method, comprising:
projecting a patterned radiation beam, through a liquid, onto a substrate using a projection system;
measuring an effect associated with a temperature fluctuation of the liquid, the measuring comprising sensing an optical characteristic of a radiation beam passing through liquid in the space, using a sensor, at the same time that the patterned radiation beam is projected onto the substrate held on the substrate table, the radiation beam sensed by the sensor not having passed through the projection system or the radiation beam sensed by the sensor coming from the projection system and sensed before or without the radiation beam re-entering the projection system; and
controlling the temperature of the liquid, an effect associated with a temperature fluctuation of the liquid, or both, based at least on the sensed optical characteristic.

21. The method of claim 20, further comprising predicting an effect associated with a temperature fluctuation of the liquid and the controlling comprises providing a feedforward control on the basis of the prediction.

22. The method of claim 21, wherein the predicting is based on a model of a thermal effect over the substrate.

23. The method of claim 20, wherein the sensor is a continuous focus measurement sensor, a magnification sensor, an aberration measurement device, or any combination of the foregoing.

24. A device manufacturing method, comprising:
projecting a patterned radiation beam, through a liquid, onto a substrate using a projection system;
measuring an effect associated with a temperature fluctuation of the liquid, the measuring comprising sensing an optical characteristic of a radiation beam passing through liquid in the space, using a sensor and measuring a focus of radiation passing through the liquid in the space, the radiation beam sensed by the sensor not having passed through the projection system or the radiation beam sensed by the sensor coming from the projection system and sensed before or without the radiation beam re-entering the projection system;
moving the optical sensor to a position under the projection system between exposures of the same substrate while the substrate is held on the substrate table; and
controlling the temperature of the liquid, an effect associated with a temperature fluctuation of the liquid, or both, based at least on the sensed optical characteristic and measured focus.

* * * * *